United States Patent [19]

Mizukami

[11] Patent Number: 4,807,196
[45] Date of Patent: Feb. 21, 1989

[54] REFRESH ADDRESS COUNTER TEST CONTROL CIRCUIT FOR DYNAMIC RANDOM ACCESS MEMORY SYSTEM

[75] Inventor: Takeshi Mizukami, Tokyo, Japan

[73] Assignee: NEC Corporation, Tokyo, Japan

[21] Appl. No.: 29,566

[22] Filed: Mar. 24, 1987

[30] Foreign Application Priority Data

Mar. 24, 1986 [JP] Japan ................................ 61-66509

[51] Int. Cl.$^4$ .................... G11C 7/00; G11C 11/40
[52] U.S. Cl. .................................... 365/222; 365/201; 365/189
[58] Field of Search .................. 371/21; 365/222, 201, 365/189

[56] References Cited

U.S. PATENT DOCUMENTS 4,453,237 6/1984 Reese et al. ..................... 365/222
4,672,583 6/1987 Nakaizumi ....................... 365/222
4,691,303 9/1987 Churchward et al. ........... 365/189 X Primary Examiner—Terrell W. Fears
Assistant Examiner—Alyssa H. Bowler
Attorney, Agent, or Firm—Sughrue, Mion, Zinn, Macpeak & Seas

[57] ABSTRACT

A semiconductor memory system with a fully automated built-in refresh control circuitry, comprising a dynamic random access memory cell array, a data transfer gate circuit through which data signals are to be transferred to or from the memory cell array, a data transfer request signal generator to produce a signal requesting activation of the gate circuit, a refresh request signal generator to produce a signal to request refreshing of the memory cell array, a refresh address counter for storing an address signal representing a memory address where the memory cell array is to be refreshed, and a refresh test control circuit responsive to the signals produced by the data transfer request and refresh request signal generators and operative to produce from the signal from the data transfer request signal generator a control signal to check the refresh address counter for proper operation during a refresh test cycle which is initiated by a signal supplied from an external source.

12 Claims, 4 Drawing Sheets

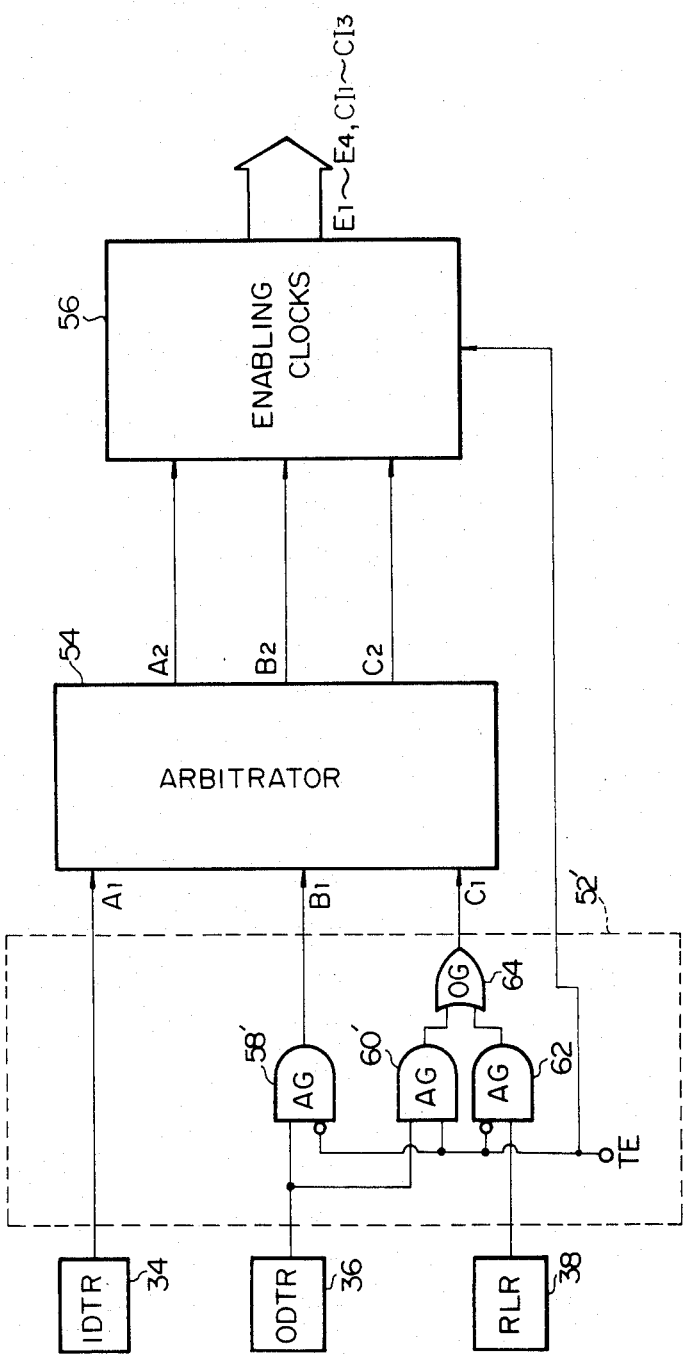

REFRESH ADDRESS COUNTER TEST CONTROL CIRCUIT FOR DYNAMIC RANDOM ACCESS MEMORY SYSTEM

FIELD OF THE INVENTION

The present invention relates in general to semiconductor memory systems and, particularly, to a dynamic random access memory system having built-in fully automated refresh control capabilities. More particularly, the present invention relates to a circuit for testing the refresh address counter of such a dynamic random access memory system to check if the refresh address counter is operating properly during operation of the memory system.

BACKGROUND OF THE INVENTION

As well known in the art, a dynamic random access memory system (hereinafter referred to as dynamic memory system) is composed of memory cells each consisting of one, two or three metal-oxide-semiconductor (MOS) transistors and a single data storage capacitor. A memory system of this type is preferred for realizing a data storage device of a large capacity for its potential possibility of high density integration on a semiconductor chip. The logic state of each cell of such a dynamic memory system is determined depending upon the quantity of positive charges, accumulated on the capacitor forming part of the cell. Thus, if the cell has positive charges stored on the capacitor thereof, the cell may represent a logic "0" state and, with no positive charge stored on the capacitor, the cell may represent a logic "1" state. The cell in a logic "0" state is in a thermally equilibrium condition while the cell in a logic "1" state is in a thermally non-equilibrium condition. Transition from the logic "1" state to the logic "0" state thus occurs in the cell in few milliseconds to several seconds. To compensate for the charges which are thus allowed to leak from the cell, the cell must be refreshed periodically at time intervals of, typically, two to three milliseconds. The requirement for such refresh operation is one of the most important causes which make a dynamic type memory device inconvenient for practical use.

One approach to providing a solution to such a problem in a dynamic memory system is to have a built-in refresh control circuitry located on the semiconductor chip on which the dynamic memory system is formed. Such a built-in refresh control circuitry typically includes a refresh timing circuit to generate refresh clock pulses and a refresh address counter responsive to the clock pulses generated by the timing circuit. The timing circuit generates refresh pulses at a predetermined frequency so that the refresh address counter is enabled to refresh the cells of the system in a fully automated fashion. A problem however still remains in a memory system of this nature primarily due to the extreme difficulties encountered in testing the refresh address counter to check if the register is operating properly.

In a dynamic semiconductor memory device furnished with such a fully automated built-in refresh control circuitry in lieu of an external or off-chip refresh control circuit, the refresh operation is started and the timing circuit begins to generate refresh clock pulses automatically when the device is switched in. Such fully automated operation of the refresh control circuitry makes it extremely difficult to check the refresh address counter for proper operation and for this reason makes it necessary to additionally provide a refresh terminal through which to control the internal timing circuit of the device.

It is, accordingly, an important object of the present invention to provide a dynamic memory system having a fully automated built-in refresh control circuitry and an internal, viz., on-chip circuit for testing the refresh address counter in the control circuitry without having recourse to the provision of an additional refresh terminal on the semiconductor chip on which the memory system is fabricated.

SUMMARY OF THE INVENTION

In accordance with one important aspect of the present invention, there is provided a semiconductor memory system with a fully automated built-in refresh control circuitry, comprising (a) a dynamic random access memory cell array, (b) at least one data transfer gate means through which data signals are to be transferred to or from the memory cell array, (c) at least one data transfer request signal generator for producing a signal to request activation of the data transfer gate means, (d) a refresh request signal generator for producing a signal to request refreshing of the memory cell array, (e) at least two memory address counters including a first memory address counter for storing an address signal representing a memory address at which a data signal transferred or to be transferred through the data transfer gate means is to be written into or read from the memory cell array, and a second memory address counter for storing an address signal representing a memory address at which the memory cell array is to be refreshed, and (f) a control circuitry for selectively activating the first and second memory address counters and the data transfer gate means, the control circuitry comprising (f-1) a refresh test control circuit responsive to the signals respectively produced by the data transfer request signal generator and the refresh request signal generator for producing output signals each depending on each of the signals from the signal generators, (f-2) an arbitrator circuit for determining the order of priority of the output signals produced by the refresh test control circuit and passing therethrough the signals from the refresh test control circuit in the aforesaid order, and (f-3) control signal generator means responsive to the signals passed through the arbitrator circuit for activating the data transfer gate means and the first memory address counter or the second memory address counter alone depending on the signal received from the arbitrator circuit, wherein the refresh test control circuit has a first condition transparent to the signals from both of the data transfer and refresh request signal generators and operative to pass the signals from the signal generators to the arbitrator circuit and a second condition transparent to the signal from the data transfer request signal generator and operative to pass the signal from the data transfer request signal generator to the arbitrator circuit.

In accordance with another important aspect of the present invention, there is provided a semiconductor memory system with a fully automated built-in refresh control circuitry, comprising (a) an input data register responsive to a data signal in the form of serial data bits and operative to output a data signal in the form of parallel data bits, (b) a dynamic random access memory cell array composed of a plurality of memory cells, (c) a write address counter for storing an address signal representing a word line of the memory cell array at which a data signal transferred through the input data register is to be written into the memory cell array, (d) first data write means through which, during an ordinary mode of operation of the memory system, a data signal outputted from the input data register is to be transferred to those memory cells of the memory cell array which are located on a word line selected on the basis of the address signal outputted from the write address counter, (e) a read address counter for storing an address signal representing a word line of the memory cell array at which a data signal is to be read from the memory cell array, (f) data read means through which, during an ordinary mode of operation of the memory system, the data bits are to be read in parallel from those memory cells of the memory cell array which are located on a word line selected on the basis of the address signal outputted from the read address counter, the data bits read from the memory cell array being outputted in series, (g) a refresh address counter for storing an address signal representing a word line of the memory cell array at which cells of the memory cell array are to be refreshed, (h) cell refresh means by which those memory cells of the memory cell array which are located on a word line selected on the basis of the address signal outputted from the refresh address counter, and (i) second data write means through which, during a refresh test mode of operation of the memory system, a data signal outputted from the input data register is to be transferred to at least one memory cell of the memory cell array which is located on a word line selected on the basis of the address signal outputted from the refresh address counter.

A semiconductor memory system thus constructed and arranged may further comprise (j) data read means through which, during a refresh test mode of operation of the memory system, data is to be read from at least one memory cell of the memory cell array which is located on a word line selected on the basis of the address signal outputted from the refresh address counter.

In accordance with still another important aspect of the present invention, there is provided a semiconductor memory system with a fully automated built-in refresh control circuitry, comprising (a) a data input circuit responsive to a data signal in the form of serial data bits and operative to output a data signal in the form of parallel data bits, (b) a dynamic random access memory cell array composed of a plurality of memory cells, (c) a data write circuit including a write address counter for storing an address signal representing a word line of the memory cell array at which a data signal transferred through the input data register is to be written into the memory cell array, the data write means being operative to write a data outputted from the data input circuit into those memory cells of the memory cell array which are selected on the basis of the address signal outputted from the write address counter, (d) a data read circuit including a read address counter for storing an address signal representing a word line of the memory cell array at which a data signal is to be read from the memory cell array, the data read means being operative to read data bits in parallel from those memory cells of the memory cell array which are selected on the basis of the address signal outputted from the read address counter, the data bits read from the memory cell array being outputted in series, (e) a cell refresh circuit including a refresh address counter for storing an address signal representing a word line of the memory cell array at which cells of the memory cell array are to be refreshed, the cell refresh circuit being operative to refresh those memory cells of the memory cell array which are selected on the basis of the address signal outputted from the refresh address counter, and (f) a refresh test circuit which is operative to read data from at least one memory cell of the memory cell array which is selected on the basis of the address signal outputted from the refresh address counter during a refresh test mode of operation of the memory system.

In a semiconductor memory system thus constructed and arranged, the refresh test circuit may comprise data write means which is operative to write data into at least one memory cell of the memory cell array which is selected on the basis of the address signal outputted from the refresh address counter during a refresh test mode of operation of the memory system.

BRIEF DESCRIPTION OF THE DRAWINGS

The features and advantages of a refresh address counter test control circuit according to the present invention will be more clearly understood from the following description taken in conjunction with the accompanying drawings in which:

FIG. 4 is a block diagram similar to FIG. 2 but now shows the arrangement of a control circuitry incorporating another preferred embodiment of a refresh address counter test control circuit according to the present invention.

DESCRIPTION OF THE PREFERRED EMBODIMENTS

Figure 1:
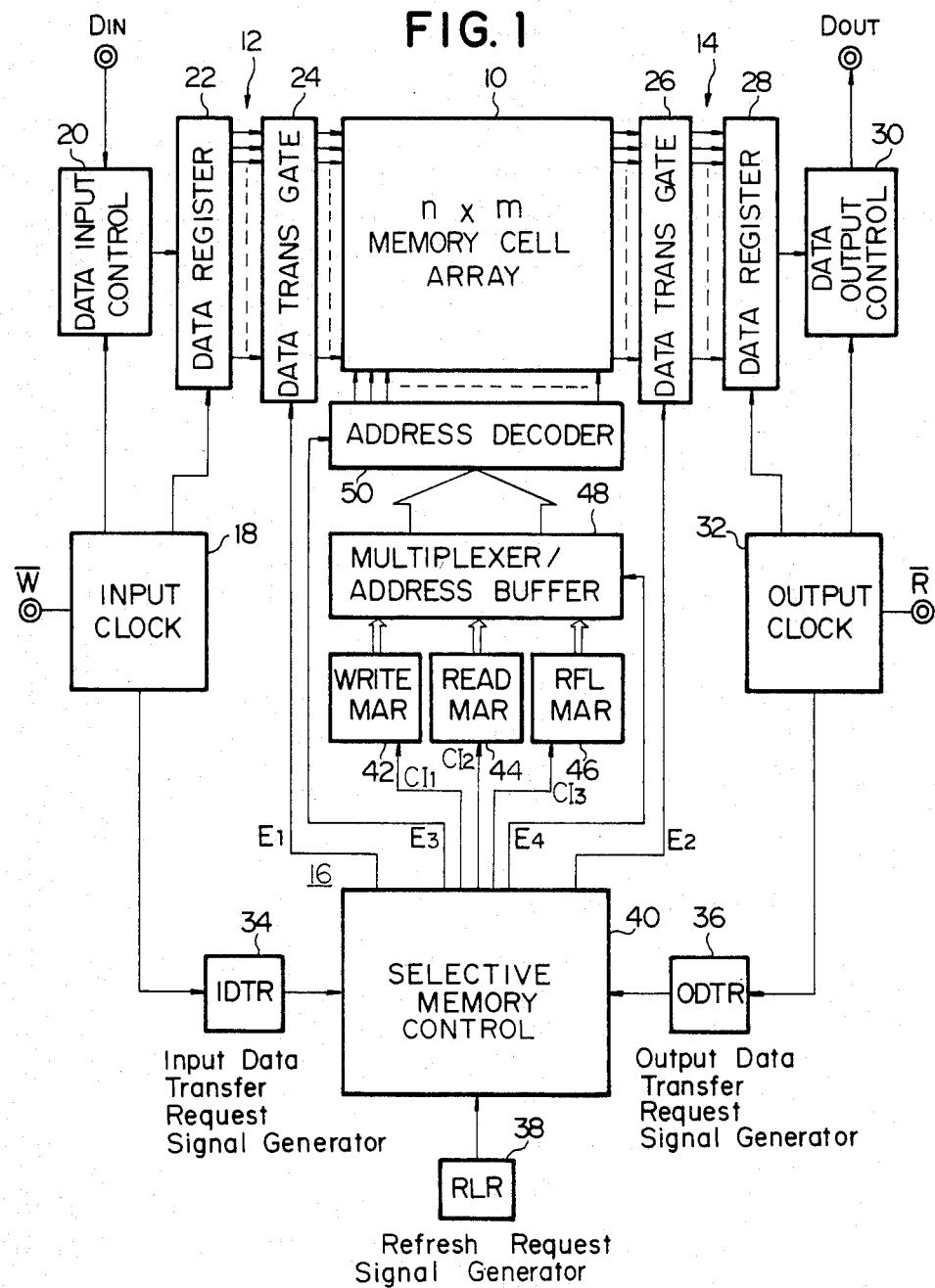
FIG. 1 is a block diagram showing the general construction and arrangement of a typical example of a dynamic memory system into which a refresh address counter test control circuit according to the present invention may be incorporated.

Referring to FIG. 1, there is shown a dynamic memory system of the dual-port type, particularly of a first-in first-out (FIFO) type in which data which has first been written into the system is to be read out first. The memory system herein shown is representative of a semiconductor memory system into which a refresh address counter test control circuit according to the present invention may be incorporated. The dual-port dynamic memory system largely comprises a memory cell array 10, a data write section 12, a data read section 14 and a memory control section 16. The memory cell array 10 has an n number of rows and an m number of columns and composed of an n by m number of dynamic memory cells. Though not shown in the drawings, each of the memory cells forming the memory cell array 10 typically consists of a combination of a single MOS field-effect transistor (FET) and a single data storage capacitor.

The data write section 12 of the system comprises an input clock generator 18, a data input control circuit 20, an m-bit input data register circuit 22 and an input data transfer gate circuit 24. The input clock generator 18 has a control terminal responsive to a data write request signal $\overline{W}$ to produce a succession of input clock pulses. The clock pulses thus produced by the input clock generator 18 are supplied to each of the data input control circuit 20 and input data register circuit 22 and further to the memory control section 16 of the system. The signal bits of a coded data signal $D_{IN}$ which represents the data to be written into the memory cell array 10 are supplied in series in synchronism with the data write request signal $\overline{W}$ and are stored in the data register circuit 22 through the data input control circuit 20 under the control of the clock pulses supplied from the input clock generator 18. The input data register circuit 22 has parallel output terminals connected through the input data transfer gate circuit 24 to the individual column lines or data lines, respectively, of the memory cell array 10 so that the data stored in the data register circuit 22 is loaded through the gate circuit 24 into the memory cell array 10. The transfer gate circuit 24 is enabled to pass the signal therethrough by a transfer enable signal $E_1$ which is supplied from the memory control section 16 of the system as will be described in more detail.

The data read section 12 of the system is inverse in the direction of flow of data to the write section 12 and comprises an output data transfer gate circuit 26, an m-bit output data register circuit 28, a data output control circuit 30 and an output clock generator 32. The signal bits representative of the data read from the memory cell array 10 are supplied in parallel to the data transfer gate circuit 26 which has input terminals connected to the individual column lines, respectively, of the memory cell array 10. The data transfer gate circuit 26 has output terminals connected to the m-bit output data register circuit 28 which in turn has an output terminal connected to the data output control circuit 30. The output clock generator 32 has a control terminal to which is supplied a data read request signal $\overline{R}$ to produce a succession of output clock pulses, which are supplied to each of the output data register circuit 28 and data output control circuit 30 and further to the memory control section 16 of the memory system. The signal bits representative of the data read from the memory cell array 10 are transferred through the data transfer gate circuit 26 in response to a transfer enable signal $E_2$ which is supplied from the memory control section 16 of the system. The data bits transferred through the output data transfer gate circuit 26 are serially supplied to the data output control circuit 30 and are then outputted therefrom as the output data signal $D_{OUT}$ in synchronism with the data read request signal $\overline{R}$ as will be described in more detail.

On the other hand, the memory control section 16 of the dynamic memory system embodying the present invention comprises an input data transfer request signal generator 34 (IDTR), an output data transfer request signal generator 36 (ODTR) and a refresh request signal generator 38 (RLR). The input data transfer request signal generator 34 is operative to produce an input data transfer request signal under the control of the clock pulses from the input clock pulse generator 18. The input data transfer request signal is produced each time the input data register circuit 22 becomes full of the data bits loaded into the register circuit 22. On the other hand, the output data transfer request signal generator 36 is operative to produce an output data transfer request signal under the control of the clock pulses from the output clock pulse generator 32. The output data transfer request signal is produced each time all the data bits which have been stored in the output data register circuit 28 are released from the register circuit 28. Furthermore, the refresh request signal generator 38 is operative to produce a refresh request signal which is in the form of a succession of pulses having a predetermined cycle.

The memory control section 16 of the dynamic memory system further comprises an on-chip control circuitry 40, write, read and refresh address counters 42, 44 and 46, a multiplexer/address buffer circuit 48 and a row address decoder 50 as shown. The control circuitry 40 has input terminals respectively connected to the signal generators 34, 36 and 38 to receive the input and output data transfer and refresh request signals produced by the signal generators 34, 36 and 38. In responce to these signals from the signal generators 34, 36 and 38, the control circuitry 40 determines the order of priority over the requests represented by the signals received and produces various enable signals. These enable signals include the transfer, or first and second, enable signals $E_1$ and $E_2$ to be supplied to the input and output data transfer gate circuits 24 and 26 of the write and read sections 12 and 14, respectively. The enable signals to be produced by the control circuitry 40 further include a third enable signal $E_3$ to be applied to the row address decoder 50 and a fourth enable signal $E_4$ to be applied to the multiplexer/address buffer circuit 48. The circuit arrangement of the control circuitry 40 to achieve such functions, as proposed by the present invention, will be described in more detail.

The multiplexer/address buffer circuit 48, which is to be enabled by the fourth enable signal $E_4$ from the control circuitry 40, has input terminals connected to the write, read and refresh address counters 42, 44 and 46 and is selectively responsive to the address signal output from any of these memory address counters 42, 44 and 46. The multiplexer/address buffer circuit 48 further has output terminals connected to the row address decoder 50. The row address decoder 50 is to be enabled by the fourth enable signal $E_4$ from the control circuitry 40 and has its output terminals connected to the individual row lines or word lines, respectively, of the memory cell array 10. The refresh address counter test control circuit under consideration is intended to check the refresh address counter 46 for proper operation.

The data write section 12 of the memory system thus constructed and arranged is enabled in response to the write request signal $\overline{W}$ which appears at the control terminal of the input clock generator 18 of the section 12. The input clock generator 18 now starts to produce a succession of input clock pulses and supplies the clock pulses to each of the data input control circuit 20 and input data register circuit 22. The clock pulses produced by the input clock generator 18 are further supplied to the input data transfer request signal generator 34 of the memory control section 16 of the system. Under the control of the clock pulses thus supplied from the input clock generator 18, the data input control circuit 20 serially passes the signal bits of the input data signal $D_{IN}$ therethrough to the n-bit input data register circuit 22. The data signal is then stored temporarily in the input data register circuit 22 also under the control of the clock pulses from the input clock generator 18.

When the input data register circuit 22 becomes full of the data bits loaded into the circuit, the input data transfer request signal generator 34 of the memory control section 16 is activated to produce the input data transfer request signal and supplies the signal to the control circuitry 40 of the section 16. The control circuitry 40 may thus be conditioned to produce the first enable signal $E_1$ for the input data transfer gate circuit 24 of the data write section 12 to activate the gate circuit 24 to release the input data signal to the memory cell array 10. In this instance, the control circuitry 40 also supplies the fourth enable signal $E_4$ to the multiplexer/address buffer circuit 48 and the third enable signal $E_3$ to the row address decoder 50. In response to the fourth enable signal $E_4$ from the control circuitry 40, the multiplexer/address buffer circuit 48 is enabled to be responsive to the address signal output from the write address counter 42 and passes the address signal from the address counter 42 to the row address decoder 50. The row address decoder 50, which is enabled by the third enable signal $E_3$ from the control circuitry 40, is now activated to decode the address signal received from the multiplexer/address buffer circuit 48. The data signal supplied from the transfer gate circuit 24 to the memory cell array 10 is written into memory cells of the memory cell array 10 at the locations designated by the address signal thus supplied from the address decoder 50 to the memory cell array 10. The starting address for the write address counter 42 is set to be the address to select the 0th row or word line of the memory cell array 10. Each time input data is passed through the input data transfer gate circuit 24, the memory control circuitry 40 issues a control signal $C_{I1}$ to the write address counter 42 to increment the content of the write address counter 42 by one. Furthermore, the input data transfer request signal generator 34 produces an intput data transfer request signal and supplies the signal to the memory control circuitry 40 when the input data register circuit 22 becomes full of the data bits successively loaded into the register circuit 22.

On the other hand, the data read section 14 of the memory system is enabled in response to the active-low read request signal $\overline{R}$ which appears at the control terminal of the output clock generator 32 of the section 14. The output clock generator 32 now starts to produce a succession of output clock pulses and supplies the clock pulses. The clock pulses produced by the output clock generator 32 are supplied to the output data transfer request signal generator 36 of the memory control section 16 of the system. The output data transfer request signal generator 36 is activated to produce the output data transfer request signal and supplies the signal to the control circuitry 40. The control circuitry 40 may thus be conditioned to produce the second enable signal $E_2$ for the output data transfer gate circuit 26 of the data read section 14 to activate the gate circuit 26 to open to the memory cell array 10. In this instance, the control circuitry 40 also supplies the third enable signal $E_3$ to the row address decoder 50 and the fourth enable signal $E_4$ to the multiplexer/address buffer circuit 48. In response to the fourth enable signal $E_4$ from the control circuitry 40, the multiplexer/address buffer circuit 48 is enabled to be responsive to the address signal output from the read address counter 44 and passes the address signal from the address counter 44 to the row address decoder 50. The row address decoder 50 is enabled by the third enable signal $E_3$ from the control circuitry 40 and is activated to decode the address signal received from the multiplexer/address buffer circuit 48. Data is now read from memory cells of the memory cell array 10 at the locations of the array 10 which are designated by the address signal thus supplied from the address decoder 50 to the memory cell array 10 and is temporarily stored in the m-bit output data register circuit 28.

The clock pulses produced by the output clock generator 32 are also supplied to each of the output data register circuit 28 and data output control circuit 30 of the read section 14 of the system. Under the control of the clock pulses thus supplied from the output clock generator 32, the signal bits of the data signal which has been stored in the m-bit output data register circuit 28 are released serially to the data output control circuit 30 in synchronism with the data read request clock signal $\overline{R}$ supplied to the output clock generator 32. The data signal thus supplied to the data output control circuit 30 is delivered from the system in the form of a coded output data signal $D_{OUT}$. The starting address for the read address counter 44 is also set to be the address to select the 0th row or word line of the memory cell array 10 so that the date which has first been written into the memory cell array 10 is first read out from the memory cell array 10. Each time output data is passed through the output data transfer gate circuit 26, the memory control circuitry 40 issues a control signal $C_{I2}$ to the read address counter 44 to increment the content of the read address counter 44 by one. Furthermore, the output data transfer request signal generator 36 produces an output data transfer request signal and supplies the signal to the memory control circuitry 40 when all the data bits which have been stored in the output data register circuit 28 are released therefrom.

When the refresh request signal is present at the output terminal of the refresh request signal generator 38 of the memory control section 16, none of the first and second enable signals $E_1$ and $E_2$ for the data transfer gate circuits 24 and 26 may be present at the output terminals of the control circuitry 40. In this instance, the multiplexer/address buffer circuit 48 is enabled to be responsive to the address signal output from the refresh address counter 46 of the control circuitry 40 and passes the address signal from the address counter 46 to the row address decoder 50. The row address decoder 50 is activated to decode the address signal received from the multiplexer/address buffer circuit 48. Accordingly, memory cells of the memory cell array 10 are refreshed at the address designated by the addresses signal thus supplied from the address decoder 50 to the memory cell array 10. Upon completion of the refreshing operation at the particular address, the memory control circuitry 40 generates a control signal $C_{I3}$ to the refresh address counter 46 to increment the content of the refresh address counter 46 by one. The starting address for the refresh address counter 46 is also set to be the address to select the 0th row or word line of the memory cell array 10.

Figure 2:
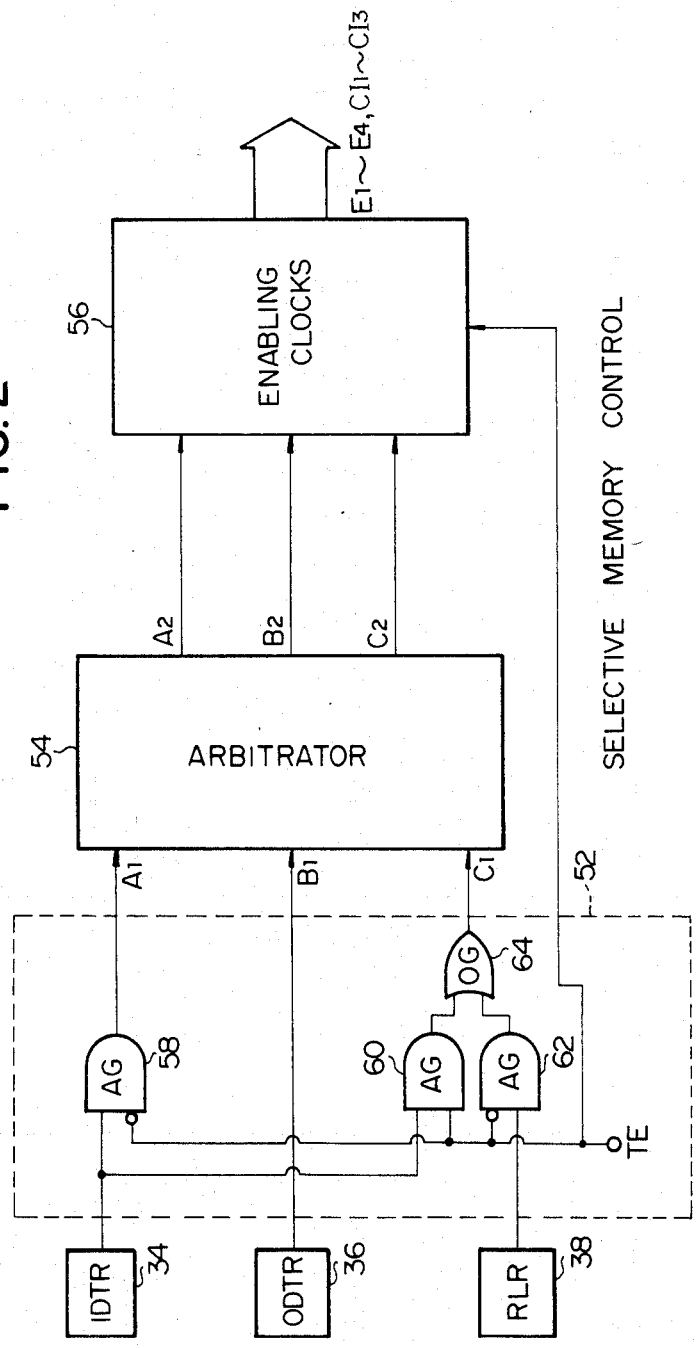
FIG. 2 is a block diagram showing the general arrangement of a control circuitry forming part of the memory system shown in FIG. 1 and incorporating a preferred embodiment of a refresh address counter test control circuit according to the present invention.

FIG. 2 shows the general arrangement of the on-chip control circuitry 40 forming part of the memory system shown in FIG. 1 and incorporating a preferred embodiment of a refresh address counter test control circuit according to the present invention. The control circuitry 40 is responsive to the signals from the input and output data transfer request signal generators 34 and 36 and refresh request signal generator 38 as described with reference to FIG. 1. In the arrangement herein shown, such a control circuitry 40 largely comprises a refresh test control circuit 52, an arbitrator circuit 54 and an enabling clock generator circuit 56. The refresh test control circuit 52 is implemented by a logic circuit which comprises two-input first, second and third AND gates 58, 60 and 62 and a single two-input OR gate 64 as shown. The first AND gate 58 has a non-inverting input terminal connected to the output terminal of the input data transfer request signal generator 34 and an inverting input terminal responsive to a test enable signal TE. The test enable signal TE herein used is assumed to be supplied from an external, viz., off-chip source (not shown) and to be an active-high signal effective to produce a normal mode of operation with a logic "0" level and a refresh test mode of operation with a logic "1" level. The second AND gate 60 has two non-inverting input terminals one connected to the output terminal of the input data transfer request signal generator 34 and the other responsive to the test enable signal TE. The third AND gate 62 has a non-inverting input terminal connected to the output terminal of the refresh request signal generator 38 and an inverting input terminal responsive to the test enable signal TE. The OR gate 64 has its non-inverting input terminals respectively connected to the output terminals of the second and third AND gates 60 and 62. Thus, the first AND gate 58 is operative to produce a logic "0" or "1" output depending upon the logic states of the output signal from the input data transfer request signal generator 34 and of the test enable signal TE. The test enable signal TE is supplied also to the enabling clock generator circuit 56.

The logic "0" or "1" output signal from the first AND gate 58 is supplied as a first output signal $A_1$ of the refresh test control circuit 52 to the arbitrator circuit 54. The output signal from the output data transfer request signal generator 36 is passed as it is through the refresh test control circuit 52 and is output from the circuit 52 to the arbitrator circuit 54 as a second output signal $B_1$ of the refresh test control circuit 52. The OR gate 64 is operative to produce a logic "0" or "1" output signal depending upon the logic states of the output signal from the input data transfer request signal generator 34 and the test enable signal TE and further on the logic state of the output signal from the refresh request signal generator 38. The logic "0" or "1" output signal from the OR gate 64 is supplied as a third output signal $C_1$ of the refresh test control circuit 52 to the arbitrator circuit 54.

When the test enable signal TE is of a logic "0" level, the first AND gate 58 is transparent to the output signal from the input data request signal generator 34. The second AND gate 60 is locked in a state producing a logic "0" output signal so that the OR gate 64 is transparent to the output signal from the third AND gate 62 and through the AND gate 62 to the output signal from the refresh request signal generator 38. Under these conditions, the signals output from the signal generators 34, 36 and 38 are passed through the refresh test control circuit 52 to the arbitrator circuit 54 as the first, second and third output signals $A_1$, $B_1$ and $C_1$, respectively, of the circuit 52. On the other hand, when the test enable signal TE is of a logic "1" level, each of the first and third AND gates 58 and 62 is locked in a state producing a logic "0" output signal. The OR gate 64 is transparent to the output signal from the second AND gate 60 and through the AND gate 60 to the output signal from the input data transfer request signal generator 34. Under these conditions, the signals output from the input and output data transfer request signal generators 34 and 36 are passed through the refresh test control circuit 52 as the third and second output signals $C_1$ and $B_1$, respectively, of the circuit 52 to the arbitrator circuit 54.

In response to the signals $A_1$, $B_1$ and $C_1$ thus output from the refresh test control circuit 52, the arbitrator circuit 54 determines the order of priority over the requests represented by the signals $A_1$, $B_1$ and $C_1$ received and produces active-high instruction signals $A_2$, $B_2$ and $C_2$. The circuit arrangement of the arbitrator circuit 54 to achieve such functions is per se well known in the art and will not be herein described and shown. The instruction signals $A_2$, $B_2$ and $C_2$ thus produced by the arbitrator circuit 54 correspond to the supplied signals $A_1$, $B_1$ and $C_1$, respectively, and are applied respectively as write data transfer, read data transfer and refresh instruction signals to the enabling clock generator circuit 56. In response to any of these write data write transfer, read data transfer and refresh instruction signals $A_2$, $B_2$ and $C_2$, the enabling clock generator circuit 56 outputs various enable signals. As described, these enable signals include the first enable signal $E_1$ for the input data transfer gate circuit 24, the second enable signal $E_2$ for the output data transfer gate circuit 26, the fourth enable signal $E_4$ for the multiplexer/address buffer circuit 48, and the third enable signal $E_3$ for the row address decoder 50. The enabling signals to be outputted from the enabling clock generator circuit 56 further include the control signals $C_{f1}$, $C_{f2}$ and $C_{f3}$ for enabling the write, read and refresh address counters 42, 44 and 46 to increment each by one under conditions hereinbefore described.

Description will now be made with reference to FIGS. 1 and 2 in regard to the operation of the dual-port dynamic memory system provided with the refresh test control circuit 52 thus constructed and arranged in accordance with the present invention. As will have been understood from the foregoing description, the transfer of the data from the input data register circuit 22 to the memory cell array 10 through the input data transfer gate circuit 24 is dictated by the first enable signal $E_1$ as well as the third and fourth enable signals $E_3$ and $E_4$ from the enabling clock generator circuit 56 of the control circuitry 40 shown in FIG. 2. Likewise, the transfer of the data from the memory cell array 10 to the output data register circuit 28 through the output data transfer gate circuit 26 is dictated by the second enable signal $E_2$ as well as the third and fourth enable signals $E_3$ and $E_4$ from the enabling clock generator circuit 56 of the control circuitry 40. On the other hand, the refresh of the memory cell array 10 is dictated by the third and fourth enable signals $E_3$ and $E_4$ from the enabling clock generator circuit 56 of the control circuitry 40. These enable signals $E_1$, $E_2$, $E_3$ and $E_4$ from the enabling clock generator circuit 56 are produced depending upon the signals $A_2$, $B_2$ and $C_2$ output from the arbitrator circuit 54 and accordingly upon the signals $A_1$, $B_1$ and $C_1$ output from the refresh test control circuit 52. The signals $A_1$ and $B_1$ to request the transfer of data to and from the memory cell array 10 from the refresh test control circuit 52, respectively, and the signal $C_1$ to request the refresh of the memory cell array 10 are produced asynchronously with respect to one another and may thus occur in overlapping relationship to each other. The arbitrator circuit 54 thus steers one of these signals $A_1$, $B_1$ and $C_1$ to the enabling clock generator circuit 56 to avoid such overlap between the requests for the data transfer and refresh rewrite operations. It may be noted that the arbitrator circuit 54 passes the signals $A_1$, $B_1$ and $C_1$ over to the enabling clock generator circuit 56 with a priority placed on the signals $A_1$, $B_1$ and $C_1$ in this order.

Assume first that the test enable signal TE supplied from the off-chip signal source is of the logic "0" level. With the logic "0" signal present at its inverting input terminal, the first AND gate 58 is made transparent to the signal from the input data transfer request signal generator 34. The signal output from the signal generator 34 is accordingly passed through the first AND gate 58 and is supplied to the arbitrator circuit 54 as the first output signal $A_1$ of the refresh test control circuit 52. In the presence of the logic "0" signal at one of its non-inverting input terminals, the second AND gate 60 is locked in a state producing a logic "0" output signal so that the OR gate 64 is made transparent to the output signal from the third AN gate 62. With the logic "0" signal present at its inverting input terminal, the third AND gate 62 is made transparent to the signal from the refresh request signal generator 38 so that the OR gate 64 becomes transparent through the AND gate 62 to the signal from the signal generator 38. The signal output from the signal generator 38 is accordingly passed through the third AND gate 62 and OR gate 64 and is supplied to the arbitrator circuit 54 as the third output signal $C_1$ of the circuit 52. Thus, all the signals output from the input and output data transfer and refresh request signal generators 34, 36 and 38 are passed through the refresh test control circuit 52 to the arbitrator circuit 54 unconditionally as the first, second and third output signals $A_1$, $B_1$ and $C_1$ respectively, of the circuit 52. As noted previously, the arbitrator circuit 54 then determines the order of priority over the requests represented by the signals $A_1$, $B_1$ and $C_1$ thus received.

The input data transfer request represented by the first output signal $A_1$ from the refresh test control circuit 52 is thus selected preferentially over the requests represented by the other signals $B_1$ and $C_1$ from the refresh test control circuit 52. In response to the first output signal $A_1$, the arbitrator circuit 54 produces the write data transfer instruction signal $A_2$ of a logic "1" level. The logic "1" write data transfer instruction signal $A_2$ is passed to the enabling clock generator circuit 56, which therefore outputs the first enable signal $E_1$ for the input data transfer gate circuit 24 as well as the third and fourth enable signals $E_3$ and $E_4$ for the row address decoder 50 and multiplexer/address buffer circuit 48. The enable signal $E_1$ output from the clock generator circuit 56 is supplied to the input data transfer gate circuit 24 of the data write section 12 so that the input data which have been stored in the n-bit input data register circuit 22 are released to the memory cell array 10 through the data transfer gate circuit 24. The input data are thus written into the memory cell array 10 at the address designated by the address signal supplied from the write address counter 42 through the multiplexer/address buffer circuit 48 and row address decoder 50 under the control of the enable signals $E_4$ and $E_3$.

When the output data transfer request represented by the second output signal $B_1$ from the refresh test control circuit 52 is produced in the absence of the signal $A_1$ from the refresh test control circuit 52, the arbitrator circuit 54 produces the read data transfer instruction signal $B_2$ of a logic "1" level. The logic "1" read data transfer instruction signal $B_2$ is passed to the enabling clock generator circuit 56, which therefore outputs the second enable signal $E_2$ for the output data transfer gate circuit 26 as well as the third and fourth enable signals $E_3$ and $E_4$ for the row address decoder 50 and multiplexer/address buffer circuit 48. The enable signal $E_2$ output from the clock generator circuit 56 is supplied to the output data transfer gate circuit 26 of the data read section 14. The data which have been read from the memory cell array 10 at the address designated by the address signal supplied from the read address counter 44 are now transferred to the m-bit output data register circuit 28 through the output data transfer gate circuit 26.

When the refresh request represented by the third output signal $C_1$ from the refresh test control circuit 52 is selected in the absence of the input and output data transfer requests represented by the other signals $A_1$ and $B_1$ from the refresh test control circuit 52, the arbitrator circuit 54 produces the refresh instruction signal $C_2$ of a logic "1" level. The logic "1" refresh instruction signal $C_2$ is passed to the enabling clock generator circuit 56, which therefore outputs only the third and fourth enable signals $E_3$ and $E_4$ for the row address decoder 50 and multiplexer/address buffer circuit 48. In the absence of the first and second enable signals $E_1$ and $E_2$ from the clock generator circuit 56, the input and output data transfer gate circuits 24 and 26 of the data write and read sections 12 and 14 remain closed so that there is no transfer of data through each of the data transfer gate circuits 24 and 26. In response to the fourth enable signal $E_4$ from the enabling clock generator circuit 56, the multiplexer/address buffer circuit 48 steers the address signal from the refresh address counter 46 to the row address decoder 50. The row address decoder 50, activated by the third enable signal $E_3$ from the enabling clock generator circuit 56, now decodes the refresh address signal received. Cells of the memory cell array 10 are accordingly refreshed at the addresses designated by the address signal thus supplied from the address decoder 50 to the memory cell array 10.

It will have been understood that, when the test enable signal TE is of a logic "0" level, the memory system under consideration operates in a normal mode performing the write, read or refresh cycles of operation depending upon the signals supplied from the signal generators 34, 36 and 38 to the control circuitry 40. In this instance, it will be apparent that, when there is no overlap between any two of the signals $A_1$, $B_1$ and $C_1$ output from the refresh test control circuit 52, the arbitrator circuit 54 allows the signals $A_1$, $B_1$ and $C_1$ to pass to the enabling clock generator circuit 56 in a sequence in which the signals are input to the circuit 54.

When, on the other hand, the test enable signal TE is of a logic "1" level, each of the first and third AND gates 58 and 62 is locked in a state producing a logic "0" output signal in the presence of the logic "0" signal at the inverting input terminal of each of the AND gates 58 and 62. The third AND gate 62 being locked in such a state, the OR gate 64 is made transparent to the output signal from the second AND gate 60, which in turn is made transparent to the signal from the input data transfer request signal generator 34 in the presence of the logic "1" signal at one of its non-inverting input terminals. It therefore follows that the OR gate 64 becomes transparent through the second AND gate 60 to the signal from the input data transfer request signal generator 34. The signal from the input data transfer request signal generator 34 is thus passed through the refresh test control circuit 52 as the third output signal $C_1$ of the circuit 52 to the arbitrator circuit 54. A refresh test cycle is thus performed by the third output signal $C_1$ of the circuit 52 as produced in response to the signal from the input data transfer request signal generator 34. Also, the signal from the output data transfer request signal generator 36 is passed through the refresh test control circuit 52 as the second output signal $B_1$ of the circuit 52 to the arbitrator circuit 54.

A refresh test mode is now establshed in the memory system so that the refresh address counter 46 is tested, for proper operation. The testing procedure for the refresh address counter 46 starts with application of the data write request clock signal $\overline{W}$ to the input clock pulse generator 18. In synchronism with the data write request clock signal $\overline{W}$ thus supplied to the input clock pulse generator 18, test data are supplied as the data signal $D_{IN}$ to the data input control circuit 20. The test data to be used in a system according to the present invention may be provided in any desired form but is herein assumed to be provided in the form of a bit sequence consisting of alternate "0" and "1" logic bits by way of example. The test data thus supplied to the data input control circuit 20 is passed to and is stored into the the input data register circuit 22. At the instant when the input data register circuit 22 becomes full of data bits, the input data transfer request signal generator 34 generates the input data transfer request signal and supplies the signal to the memory control circuitry 40. This causes the memory control circuitry 40 to produce the third output signal $C_1$ of, typically, a logic "1" level from the refresh test control circuit 52 and supplies the signal $C_1$ to the arbitrator circuit 54. In response to the logic "1" output signal $C_1$ from the refresh test control circuit 52, the arbitrator circuit 54 outputs a signal $C_2$ of also logic "1" level, which is applied as the refresh instruction signal to the enabling clock generator circuit 56. It therefore follows that the enabling clock generator circuit 56 outputs the first, third and fourth enable signals $E_1$, $E_3$ and $E_4$. As noted previously, the first enable signal El is supplied to the input data transfer gate circuit 24 while the fourth enable signal $E_4$ is supplied to the row address decoder 50 and the third enable signal $E_3$ supplied to the multiplexer/address buffer circuit 48. Supplied with the third enable signal $E_3$, the multiplexer/address buffer circuit 48 is activated to select the refresh address counter 46 so that the row address decoder 50 which is activated by the fourth enable signal $E_4$ to select a particular row or word line of the memory cell array 10 on the basis of the address information supplied from the refresh address counter 46.

As previously noted, the test enable signal TE active on the refresh test control circuit 52 and enabling clock generator circuit 56 is assumed to be an active-high signal effective to produce a normal mode of operation with a logic "0" level and a refresh test mode of operation with a logic "1" level. During a normal mode of operation established with the test enable signal TE of the logic "0" level, the enabling clock generator circuit 56 is operative to produce the first enabling signal $E_1$ in response to the first instruction signal $A_2$ from the arbitrator circuit 54 as also previously noted. During a refresh mode of operation selected with the test enable signal TE of the logic "1" level, however, the enabling clock generator circuit 56 is operative to produce the first enabling signal $E_1$ in response to the third instruction signal $C_2$ in lieu of the first instruction signal $A_2$ from the arbitrator circuit 54.

By the first enable signal $E_1$ thus supplied from the enabling clock generator circuit 56 of the memory control circuitry 40, the input data transfer gate circuit 24 is activated so that the test data which have been stored in the input data register circuit 22 are passed through the gate circuit 24 to the memory cell array 10. The test data are thus written into memory cells of the array 10 at the addresses selected by the row address decoder 50 which is responsive to the address signal supplied from the refresh address counter 46 through the multiplexer/address buffer circuit 48. It will thus be understood that the system embodying the present invention is characterized in that, inter alia, refresh test cycles are performed in synchronism with the cycles in which the data write request clock signal $\overline{W}$ appears at the control terminal of the input clock generator 18 in the presence of the test enable signal TE of the logic "1" level. During each of such refresh test cycles, test data are inputted into the system in response to the data write request clock signal $\overline{W}$ applied to the input clock generator 18 and are written into the memory cell array 10 at the addresses designated by the refresh address counter 46. After a particular row or word line has been selected in the memory cell array 10, the enabling clock generator circuit 56 of the memory control circuitry 40 produces the control signal $C_{l3}$ and supplies the signal $C_{l3}$ to the refresh address counter 46, which is thus conditioned to increment by one.

At a point of time the input data register circuit 22 becomes full of the test data which has been loaded thereinto in response to the data write request clock signal $\overline{W}$ which appears during the subsequent refresh test cycle, the input data transfer request signal generator 34 produces the input data transfer request signal for a second time. It therefore follows that the test data stored in the input data register circuit 22 are written into cells of the memory cell array 10 at the addresses designated by the next address signal outputtted from the refresh address counter 46 which has been incemenented by one as above discussed. All the row or word lines will thus be selected with the refresh address counter 46 incremented successively until the address effective in the counter 46 recycles to the starting address. The refresh test mode of operation of the system is brought to an end when all the row or word lines of the memory cell array 10 are accessed.

It may be noted that the content of the refresh address counter 46 could not be altered improperly during a refresh test mode of operation. In case the refresh request signal generator 38 happens to produce the refresh request signal while test data are being written into the memory cell array 10, such a request is disregarded by the refresh test control circuit 52 or, more specifically, the third AND gate 62 of the control circuit 52.

After test data have been written into the memory cell array 10 at all the row or word lines of the array 10, then the data read request clock signal $\overline{R}$ appears at the control terminal of the output clock generator 32. The test data stored in the memory cell array 10 are thus read out from each of the row or word lines of the array as in an ordinary read mode of operation of the system. If the refresh address counter 46 was operating properly during the refresh test mode of operation, logic "0" and "1" data bits must appear alternately in the data read section 14 as the test data are thus read from the memory cell array 10. Whether the refresh address counter 46 is operative properly or not can accordingly be determined by checking into the data read from the memory cell array 10. The readout of the test data from the memory cell array 10 may be effected either in a refresh test mode or in an ordinary read mode of operation of the system.

During an actual write cycle of operation in which data is to be written into the memory cell array 10, it is important that the input data transfer gate circuit 24 be activated to open at the instant the m number of bits of the coded data signal $D_{IN}$ have been completely loaded into the input data register circuit 22. It will however be understood that, for the purpose of testing the refresh address counter 46 using the signal from the input data transfer gate circuit 24, the input data transfer gate circuit 24 need not be activated to open at the point of time the whole sequence of the m number of bits of the data signal $D_{IN}$ has been loaded into the input data register circuit 22. For this reason, the input data transfer gate circuit 24 may be activated to open by the enable signal $E_1$ from the control circuitry 40 at the instant the starting bit of the n-bit coded data signal $D_{IN}$ is loaded into the input data register circuit 22. This will contribute to significant reduction in the period of time required for the testing of the refresh address counter 46. The period of cycle of the write request signal $\overline{W}$ to achieve such a purpose may be selected to be only slightly longer than the period of time of, for example, several hundreds of nanoseconds as required for the refreshing of the memory cell array 10.

While the refresh test control circuit 52 of the memory control circuitry 40 of the system embodying the present invention has hereinbefore described to be arranged so that the signal $C_1$ to be inputted to the arbitrator circuit 54 is shifted to a logic "1" level by the input data transfer request signal from the input data transfer request signal generator 34. Such a refresh test control circuit may be modified so that the signal $C_1$ is shifted to a logic "1" level by the data write request clock signal $\overline{W}$ to be supplied to the control terminal of the input clock generator 18. Such an arrangement will be advantageous for reducing the time duration of the test data write cycle and accordingly the total period of time required for the testing of the address counter 46 since the content of the refresh address counter 46 is updated each time test data are supplied to the system.

As has been noted, the test enable signal TE herein used is assumed to be supplied from an external, viz., off-chip source and is preferably an active-high signal effective to produce a normal mode of operation when having a logic "0" level and a refresh test mode of operation with a logic "1" level. If desired, however, the testing of the refresh address counter 46 may be controlled with use of a test enable signal generator circuit using an existing on-chip terminal such as an active-low write-enable signal $\overline{W}$ or an active-low read-enable signal $\overline{R}$. An example of such a test enable signal generator circuit is shown in FIG. 3

Figure 3:
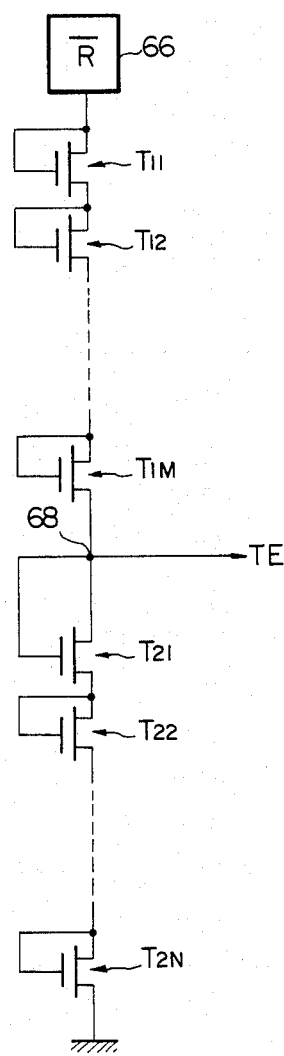
FIG. 3 is a circuit diagram showing a preferred example of a test enable signal generator circuit using an existing on-chip terminal to produce a test enable signal for use in the control circuitry shown in FIG. 2.

The test enable signal generator circuit shown in FIG. 3 comprises a series combination of an M number of MOS field-effect transistors $T_{11}, T_{12}, \ldots T_{1M}$ and a series combination of an N number of MOS field-effect transistors $T_{21}, T_{22}, \ldots T_{2N}$. The two sets of field-effect transistors $T_{11}$ to $T_{1M}$ and $T_{21}$ to $T_{2N}$ are connected in series between a read enable signal supply terminal 66 and a ground line. It will be seen that the two series combinations of the field-effect transistors thus connected together form a gate-source load voltage divider circuit. The ratio between the numbers M and N of the transistors is selected so that the voltage produced by such a voltage divider is lower than the standardized voltage level of, for example, a maximum of 6.0 volts of the read enable signal $\overline{R}$ of a logic "1" level and higher than the standardized voltage level of, for example, 8.0 to 10.0 volts of the read enable signal $\overline{R}$ of the logic "1" level. The voltage thus produced at a node 68 between the series combination of the transistors $T_{11}, T_{12}, \ldots T_{1M}$ and the series combination of the transistors $T_{21}, T_{22}, \ldots T_{2N}$ can be advantageously used as the on-chip terminal for the test enable signal TE for use in the refresh test control circuit 52 of the control circuitry 40 shown in FIG. 3.

While a refresh test cycle is performed in response to the signal from the input data transfer request signal generator 34 in the embodiment hereinbefore described, such an embodiment of a refresh address counter test control circuit according to the present invention may be modified so that a refresh test cycle is performed in response to the signal from the output data transfer request signal generator 36.

FIG. 4 of the drawings shows such a modification of the embodiment shown in FIG. 2. The control circuitry shown in FIG. 4 comprises a refresh test control circuit 52' which is basically similar to its counterpart in the control circuitry 40 shown in FIG. 2 and which also comprises three two-input AND gates and a single two-input OR gate. The AND gates include a first AND gate 58' arranged in association with the output data transfer request signal generator 36. The AND gate 58' has a non-inverting input terminal connected to the output terminal of the output data transfer request signal generator 36 and an inverting input terminal responsive to the active-high test enable signal TE. Thus, the first AND gate 58' in the embodiment herein shown is operative to produce a logic "0" or "1" output depending upon the logic states of the output signal from the output data transfer request signal generator 34 and of the test enable signal TE. The logic "0" or "1" output signal from the first AND gate 58' is supplied as the second output signal $B_1$ of the refresh test control circuit 52' to the arbitrator circuit 54. The output signal from the input data transfer request signal generator 34 is passed as it is through the refresh test control circuit 52' and is output from the circuit 52' to the arbitrator circuit 54 as the output signal $A_1$ of the refresh test control circuit 52. The first AND gate 58' is provided in combination with second and third AND gates 60 and 62 and a single two-input OR gate 64 which are all arranged similarly to their counterparts in the control circuitry 40 shown in FIG. 2. Thus, a logic "0" or "1" output signal from the OR gate 64 is supplied as the third output signal $C_1$ of the refresh test control circuit 52' to the arbitrator circuit 54 as in the embodiment of FIG. 2.

When the test enable signal TE is of a logic "1" level, each of the first and third AND gates 58' and 62 is locked in a state producing a logic "0" output signal. The OR gate 64 is therefore made transparent to the output signal from the second AND gate 60 and through the AND gate 60 to the output signal from the output data transfer request signal generator 36. Under these conditions, the signals output from the input and output data transfer and refresh request signal generators 34 and 36 are passed through the refresh test control circuit 52' as the first and third output signals $A_1$ and $C_1$, respectively, of the circuit 52' to the arbitrator circuit 54. The testing of the refresh address counter 46 is started by supplying test data to the data write section 12 of the memory system in synchronism with the data write request clock signal $\overline{W}$ applied to the control terminal of the input clock generator 18. The test data is written into the memory cell array 10 in a manner described previously and, thereafter, the data read request clock signal $\overline{R}$ is supplied to the control terminal of the outtput clock generator 32. Appropriate row or word lines are thus selected in the memory cell array 10 depending on the contents, of the refresh address counter 46 by means of the refresh test control circuit 52' of the memory control circuitry 40. If the output data transfer request signal generator 38 happens to produce the output data transfer request signal while the test data which have been written into the memory cell array 10 are being read out therefrom, such a request is disregarded by the refresh test control circuit 52' or, more specifically, the third AND gate 62 of the control circuit 52. On the other hand, the enabling clock generator circuit 56 of the control circuitry 40 produces the second enable signal $E_2$ in response to the test enable signal TE and supplies the signal, to the output data transfer gate circuit 26. Since the refresh address counter 46 and write address counter 42 have a common starting address, the test data read out from the memory cell array 10 will be in conformity to the test data which have been written into the array 10 so long as the refresh address counter 46 is operating properly. This provides the basis on which whether the refresh address counter 46 is operative properly or not is to be determined.

If desired, the refresh test control circuit 52 shown in FIG. 2 and the refresh test control circuit 52' shown in FIG. 4 may be combined together. In this instance, test data are to be written into cells of the memory cell array 10 at the addresses on the row or word lines selected by the address signals from the refresh address counter 46 and are read out from the cells of the memory cell array 10 on the row or word lines also selected by the address signals from the refresh address counter 46. This provides an advantage that the testing of the refresh address counter 46 can be performed with an enhanced degree of accuracy.

It will have been understood from the foregoing description that a refresh address counter test control circuit according to the present invention is, inter alia, characterized in that a refresh test cycle is performed in response to the signal from either the input data transfer request signal generator 34 or the output data transfer request signal generator 36 which dictates the transfer of data through the input or output data transfer gate circuit 24 or 26 to or from the memory cell array 10. Such a refresh address counter test control circuit is advantageous particular in a dynamic memory system of the type having fully automated built-in refresh control capabilities since the refresh address counter provided in the system can be checked for proper operation easily and with use of a simple circuit arrangement the memory system has no external or off-chip refresh control terminal. A refresh address counter test control circuit according to the present invention is further characterized in that, since the period of data transfer cycle can be readily adjustable from the outside of the system, the refresh cycle to be performed through utilization of the data transfer request signal can also be easily adjustable.

What is claimed is:

1. A semiconductor memory system with a fully automated built-in refresh control circuitry, comprising
    (a) a dynamic random access memory cell array,
    (b) at least one data transfer gate means through which data signals are to be transferred to or from said memory cell array,
    (c) at least one data transfer request signal generator for producing a signal to request activation of said data transfer gate means,
    (d) a refresh request signal generator for producing a signal to request refreshing of said memory cell array,
    (e) at least two memory address counters including a first memory address counter for storing an address signal representing a memory address at which a data signal transferred or to be transferred through said data transfer gate means is to be written into or read from said memory cell array, and a second memory address counter for storing an address signal representing a memory address at which said memory cell array is to be refreshed, and
    (f) a control circuitry for selectively activating said first and second memory address counters and said data transfer gate means, the control circuitry comprising
    (f-1) a refresh test control circuit responsive to the signals respectively produced by said data transfer request signal generator and said refresh request signal generator for producing output signals each depending one each of the signals from the signals generators respectively,
    (f-2) an arbitrator circuit for determining the order of priority of the output signals produced by said refresh test control circuit and passing therethrough the signals from the refresh test control circuit in said order, and
    (f-3) control signal generator means responsive to the signals passed through said arbitrator circuit for activating said data transfer gate means and said first memory address counter or said second memory address counter alone depending on the signal received from the arbitrator circuit,
    wherein said refresh test control circuit has a first condition transparent to the signal from both of said data transfer and refresh request signal generators and operative to pass the signals from the signal generators to said arbitrator circuit and a second condition transparent to the signal from said data transfer request signal generator and, without respect to the signal from said refresh request signal generator, operative to pass the signal from the data transfer request signal generator to said arbitrator circuit not as a signal to request activation of said data transfer gates means but as a refresh request signal requesting refreshing of said memory cell array for enabling said control signal generator means to activate said second memory address counter responsive to the refresh request signal passed through the refresh test control circuit to said arbitrator circuit and through the arbitrator circuit to said control signal generator means.

2. A semiconductor memory system as set forth in claim 1, in which said refresh test control circuit is responsive to a refresh test control signal supplied from an external signal source and comprises a first logic AND gate circuit having an inverting input terminal responsive to said refresh test control signal, a non-inverting input terminal responsive to the signal from said data transfer request signal generator, and an output terminal connected to said arbitrator circuit, a second logic AND gate circuit having a non-inverting input terminal responsive to said refresh test control signal and a non-inverting input terminal responsive to the signal from said data transfer request signal generator, a third logic AND gate circuit having an inverting input terminal responsive to said refresh test control signal and a non-inverting input terminal responsive to the signal from said refresh request signal generator, and a logic OR gate circuit having two input terminals respectively connected to the output terminals of said second and third logic AND gate circuits, and an output terminal connected to said arbitrator circuit.

3. A semiconductor memory system with a fully automated built-in refresh control circuitry, comprising
 (a) a dynamic random access memory cell array,
 (b) at least one data transfer gate means through which data signals are to be transferred to or from said memory cell array,
 (c) at least one data transfer request signal generator for producing a signal to request activation of said data transfer gate means,
 (d) a refresh request signal generator for producing a signal to request refreshing of said memory cell array,
 (e) at least two memory address counters including a first memory address counter for storing an address signal representing a memory address at which a data signal transferred or to be transferred through said data transfer gate means is to be written into or read from said memory cell array, and a second memory address counter for storing an address signal representing a memory address at which said memory cell array is to be refreshed, and
 (f) a control circuitry for selectively activating said first and second memory address counters and said data transfer gate means, the control circuitry comprising
  (f-1) a refresh test control circuit responsive to the signals respectively produced by said data transfer request signal generator and said refresh request signal generator for producing output signals each depending on each of the signals from the signal generators,
  (f-2) an arbitrator circuit for determining the order of priority of the output signals produced by said refresh test control circuit and passing therethrough the signals from the refresh test control circuit in said order, and
  (f-3) control signal generator means responsive to the signals passed through said arbitrator circuit for activating said data transfer gate means and said first memory address counter or said second memory address counter alone depending on the signal received from the arbitrator circuit,
 wherein said refresh test control circuit has a first condition transparent to the signals from both of said data transfer and refresh request signal generators and operative to pass the signals from the signal generators to said arbitrator circuit and a second condition transparent to the signal from said data transfer request signal generator and operative to pass the signal from the data transfer request signal generator to said arbitrator circuit, and wherein said refresh test control circuit is responsive to a refresh test control signal supplied from an external signal source and comprises (i) a first logic AND gate circuit having an inverting input terminal responsive to said refresh test control signal, a non-inverting input terminal responsive to the signal from said data transfer request signal generator, and an output terminal connected to said arbitrator circuit,
 (ii) a second logic AND gate circuit having a non-inverting input terminal responsive to said refresh test control signal and a non-inverting input terminal responsive to the signal from said data transfer request signal generator,
 (iii) a third logic AND gate circuit having an inverting input terminal responsive to said refresh test control signal and a non-inverting input terminal responsive to the signal from said refresh request signal generator, and
 (iv) a logic OR gate circuit having two input terminals respectively connected to the output terminals of said second and third logic AND gate circuits, and an output terminal connected to said arbitrator circuit.

4. A semiconductor memory system with a fully automated built-in refresh control circuitry, comprising
 (a) a dynamic random access memory cell array,
 (b) input data transfer gate means through which a data signal is to be transferred to said memory cell array,
 (c) output transfer gate means through which a data signal is to be transferred from said memory cell array,
 (d) an input data transfer request signal generator for producing a signal to request activation of said input data transfer gate means,
 (e) an output data transfer request signal generator for producing a signal to request activation of said output data transfer gate means,
 (f) a refresh request signal generator for producing a signal to request refreshing of said memory cell array,
 (g) a write address counter for storing an address signal representing a memory address at which a data signal transferred through said input data transfer gate means is to be written into said memory cell array,
 (h) a read address counter for storing an address signal representing a memory address at which a data signal to be transferred through said output data transfer gate means is to be read from said memory cell array,
 (i) a refresh address counter for storing an address signal representing a memory address at which said memory cell array is to be refreshed, and
 (j) a control circuitry for selectively activating said write, read and refresh address counters and said input and output data transfer gate means, the control circuitry comprising
  (j-1) a refresh test control circuit responsive to the signals respectively produced by said input and output data transfer request signal generators and said refresh request signal generator for producing output signals each depending on each of the signals from the signal generators, (j-2) an arbitrator circuit for determining the order of priority of the output signals produced by said refresh test control circuit and passing therethrough the signals from the refresh test control circuit in said order, and (j-3) control signal generator means responsive to the signals passed through said arbitrator circuit for activating one of said input and output data transfer gate means and one of said write and read address counters or said refresh address counter alone depending on the signal received from the arbitrator circuit, wherein said refresh test control circuit has a first condition transparent to the signals from all of said input and output data transfer and refresh request signal generators and operative to pass the signals from all the signal generators to said arbitrator circuit and a second condition transparent to the signal from predetermined one of said input and output data transfer request signal generators and operative to pass the signal from the predetermined one of the data transfer request signals generators to said arbitrator circuit, and wherein said output data transfer request signal generator has an output terminal connected to said arbitrator circuit and in which said refresh test control circuit is responsive to a refresh test control signal supplied from an external signal source and comprises (i) a first logic AND gate circuit having an inverting input terminal responsive to said refresh test control signal, a non-inverting input terminal responsive to the signal from said input data transfer request signal generator, and an output terminal connected to said arbitrator circuit, (ii) a second logic AND gate circuit having a non-inverting input terminal responsive to said refresh test control signal and a non-inverting input terminal responsive to the signal from said input data transfer request signal generator, (iii) a third logic AND gate circuit having an inverting input terminal responsive to said refresh test control signal and a non-inverting input terminal responsive to the signal from said refresh request signal generator, and (iv) a logic OR gate circuit having two input terminals respectively connected to the output terminals of said second and third logic AND gate circuits, and an output terminal connected to said arbitrator circuit.

5. A semiconductor memory system with a fully automated built-in refresh control circuitry, comprising (a) a dynamic random access memory cell array, (b) input data transfer gate means through which a data signal is to be transferred to said memory cell array, (c) output transfer gate means through which a data signal is to be transferred from said memory cell array, (d) an input data transfer request signal generator for producing a signal to request activation of said input data transfer gate means, (e) an output data transfer request signal generator for producing a signal to request activation of said output data transfer gate means, (f) a refresh request signal generator for producing a signal to request refreshing of said memory cell array, (g) a write address counter for storing an address signal representing a memory address at which a data signal transferred through said input data transfer gate means is to be written into said memory cell array, (h) a read address counter for storing an address signal representing a memory address at which a data signal to be transferred through said output data transfer gate means is to be read from said memory cell array, (i) a refresh address counter for storing an address signal representing a memory address at which said memory cell array is to be refreshed, and (j) a control circuitry for selectively activating said write, read and refresh address counters and said input and output data transfer gate means, the control circuitry comprising (j-1) a refresh test control circuit responsive to the signals respectively produced by said input and output data transfer request signal generators and said refresh request signal generator for producing output signals each depending on each of the signals from the signal generators, (j-2) an arbitrator circuit for determining the order of priority of the output signals produced by said refresh test control circuit and passing therethrough the signals from the refresh test control circuit in said order, and (j-3) control signal generator means responsive to the signals passed through said arbitrator circuit for activating one of said input and output data transfer gate means and one of said write and read address counters or said refresh address counter alone depending on the signal received form the arbitrator circuit, wherein said refresh test control circuit has a first condition transparent to the signals from all of said input and output data transfer and refresh request signal generators and operative to pass the signals from all the signal generators to said arbitrator circuit and a second condition transparent to the signal from predetermined one of said input and output data transfer request signal generators and operative to pass the signal from the predetermined one of the data transfer request signal generators to said arbitrator circuit, and wherein said input data transfer request signal generator has an input terminal connected to said arbitrator circuit and in which said refresh test control circuit is responsive to a refresh test control signal supplied from an external signal source and comprises (i) a first logic AND gate circuit having an inverting input terminal responsive to said refresh test control signal, a non-inverting transfer request signal generator, and an input terminal connected to said arbitrator circuit, (ii) a second logic AND gate circuit having a non-inverting input terminal responsive to said refresh test control signal and a non-inverting input terminal responsive to the signal from said input data transfer request signal generator, (iii) a third logic AND gate circuit having an inverting input terminal responsive to said refresh test control signal and a non-inverting input terminal responsive to the signal from said refresh request signal generator, and (iv) a logic OR gate circuit having two input terminals respectively connected to the output terminals of said second and third logic AND gate circuits, and an input terminal connected to said arbitrator circuit.

6. A semiconductor memory system with a fully automated built-in refresh control circuitry, comprising (a) an input data register responsive to a data signal in the form of serial data bits and operative to output data signal in the form of parallel data bits, (b) a dynamic random access memory cell array composed of a plurality of memory cells, (c) a write address counter for storing an address signal representing a word line of said memory cell array at which a data signal transferred through said input data register is to be written into said memory cell array, (d) a first data write means through which, during an ordinary mode of operation of the memory system, a data signal outputted from said input data register is to be transferred to those memory cells of said memory cell array which are located on a word line selected on the basis of the address signal outputted from said write address counter, (e) a read address counter for storing an address signal representing a word line of said memory cell array at which a data signal is to be read from said memory cell array, (f) data read means through which, during an ordinary mode of operation of the memory system, the data bits are to be read in parallel from those memory cells of said memory cell array which are located on a word line selected on the basis of the address signal outputted from said read address counter, the data bits read from said memory cell array being outputted in series, (g) a refresh address counter for storing an address signal representing a word line of said memory cell array at which cells of the memory cell array are to be refreshed, (h) cell refresh means by which those memory cells of said memory cell array which are located on a word line selected on the basis of the address signal outputted from said refresh address counter, and (i) second data write means through which, during a refresh test mode of operation of the memory system, a data signal outputted in the form of parallel data bits from said input data register are to be transferred to a plurality of memory cells of said memory cell array which are located on a word line selected on the basis of the address signal outputted from said refresh address counter.

7. A semiconductor memory system as set forth in claim 6, further comprising (j) second data means through which, during a refresh test mode of operation of the memory system, data in the form of parallel data bits are to be read from a plurality of memory cells of said memory cell array which are located on a word line selected on the basis of the address signal outputted from said refresh address counter, the data bits of the data read from the memory cells located on said word line being serially outputted from said second data read means.

8. A semiconductor memory system as set forth in claim 6, in which said refresh test circuit comprises data write means which is operative to write data into at least one memory cell of said memory cell array which is selected on the basis of the address signal outputted from said refresh address counter during a refresh test mode of operation of the memory system.

9. A semiconductor memory system with a fully automated built-in refresh control circuitry, comprising (a) a data input circuit responsive to the data signal in the form of serial data bits and operative to output a data signal in the form of parallel data bits, (b) a dynamic random access memory cell array composed of a plurality of memory cells, (c) a data write circuit including a write address counter for storing an address signal representing a word line of said memory cell array at which a data signal transferred through said input data register is to be written into said memory cell array, the data write means being operative to write a data outputted from said data input circuit into those memory cells of said memory cell array which are selected on the basis of the address signal outputted from said write address counter, (d) a data read circuit including a read address counter for storing an address signal representing a word line of said memory cell array at which a data signal is to be read from said memory cell array, the data read means being operative to read data bits in parallel from those memory cells of said memory cell array which are selected on the basis of the address signal outputted from said read address counter, the data bits read from said memory cell array being outputted in series, (e) a cell refresh circuit including a refresh address counter for storing an address signal representing a word line of said memory cell array at which cells of the memory cell array are to be refreshed, the cell refresh circuit being operative to refresh those memory cells of said memory cell array which are selected on the basis of the address signal outputted from said refresh address counter, and (f) a refresh test circuit which is operative to read data from at least one memory cell of said memory cell array which is selected on the basis of the address signal outputted from said refresh address counter during a refresh test mode of operation of the memory system.

10. A semiconductor memory system with a fully automated built-in refresh control circuitry, comprising (a) a dynamic random access memory cell array, (b) input data transfer gate means through which a data signal is to be transferred from said memory cell array, (c) output data transfer gate means through which a data signal is to be transferred from said memory cell array, (d) an input data transfer request signal generator for producing a signal to request activation of said input data transfer gate means, (e) an output data transfer request signal generator for producing a signal to request activation of said output data transfer gate means, (f) a refresh request signal generator for producing a signal to request refreshing of said memory cell array, (g) a write address counter for storing an address signal representing a memory address at which a data signal transferred through said input data transfer gate means is to be written into said memory cell array, (h) a read address counter for storing an address signal representing a memory address at which a data signal to be transferred through said output data transfer gate means is to be read from memory cell array, (i) a refresh address counter for storing an address signal representing a memory address at which said memory cell array is to be refreshed, and (j) a control circuitry for selectively activating said write, read and refresh address counters and said input and output data transfer gate means, the control circuitry comprising (j-1) a refresh test control circuit responsive to the signals respectively produced by said input and output data transfer request signal generators and said refresh request signal generator for producing output signals each depending on each of the signals from the signal generators, (j-2) an arbitrator circuit for determining the order of priority of the output signals produced by said refresh test control circuit and passing therethrough the signals from the refresh test control circuit in said order, and (j-3) control signal generator means responsive to the signals passed through said arbitrator circuit for activating one of said input and output data transfer gate means and one of said write and read address counters or said refresh address counter alone depending on the signal received from the arbitrator circuit, wherein said refresh test control circuit has a first condition transparent to the signals from all of said input and output data transfer and refresh request signal generators and operative to pass and the signals from all the signal generators to said arbitrator circuit and a second condition transparent to the signal from a predetermined one of said input and output data transfer request signal generators and, without respect to the signal from said refresh request signal generator, operative to pass the signal from the predetermined one of the data transfer request signal generators to said arbitrator circuit not as a signal to request activation of said data transfer gate means but as a refresh signal requesting refreshing of said memory cell array for enabling said control signal generator means activate said refresh address counter response to the refresh request signal passed through the refresh test control circuit to said arbitrator circuit and through the arbitrator circuit to said control signal generator means.

11. A semiconductor memory system as set forth in claim 10, in which said output data transfer request signal generator has an output terminal connected to said arbitrator circuit and in which said refresh test control circuit is responsive to a refresh test control signal supplied from an external signal source and comprises a first logic AND gate circuit having an inverting input terminal responsive to said refresh test control signal, a non-inverting input terminal responsive to the signal from said input data transfer request signal generator, and an output terminal connected to said arbitrator circuit, a second logic AND gate circuit having a non-inverting input terminal responsive to said refresh test control signal and a non-inverting input terminal responsive to the signal from said input data transfer request signals generator, a third logic AND circuit having an inverting input terminal responsive to said refresh test control signal and a non-inverting input terminal responsive to the signal from said refresh request signal generator, and a logic OR gate circuit having two input terminals respectively connected to the output terminals of said second and third logic AND gate circuits, and an output terminal connected to said arbitrator circuit.

12. A semiconductor memory system as set forth in claim 10, in which said input data transfer request signal generator has an input terminal connected to said arbitrator circuit and in which said refresh test control circuit is responsive to a refresh test control signal supplied from an external signal source and comprises a first logic AND gate circuit having an inverting input terminal responsive to said refresh test control signal, a non-inverting input terminal responsive to the signal from said output data transfer request signal generator, and an input terminal connected to said arbitrator circuit, a second logic AND gate circuit having a non-inverting input terminal responsive to said refresh test control signal and a non-inverting input terminal responsive to the signal from said output data transfer request signal generator, a third logic AND gate circuit having an inverting input terminal responsive to said refresh test control signal and a non-inverting input terminal responsive to the signal from said refresh request signal generator, and a logic OR gate circuit having two output terminals respectively connected to the input terminals of said second and third logic AND gate circuits, and an input terminal connected to said arbitrator circuit.

* * * * *

UNITED STATES PATENT AND TRADEMARK OFFICE
CERTIFICATE OF CORRECTION

PATENT NO. : 4,807,196
DATED : February 21, 1989
INVENTOR(S) : TAKESHI MIZUKAMI

It is certified that error appears in the above-identified patent and that said Letters Patent is hereby corrected as shown below:

Col. 5, line 3, delete "n" and insert --$n$--, delete "m" and insert --$m$--.

line 4, delete "n by m" and insert --$n$ by $m$--.

line 12, delete "m-bit" and insert --$m$-bit--.

line 40, delete "m-bit" and insert --$m$-bit--.

line 47, delete "m-bit" and insert --$m$-bit--.

Col. 7, line 6, delete "n-bit" and insert --$n$-bit--.

line 45, delete "intput" and insert --input--.

Col. 8, line 15, delete "m-bit" and insert --$m$-bit--.

line 22, delete "m-bit" and insert --$m$-bit--.

line 57, delete "the address designated by the addresses signal" and insert --the addresses designated by the address signal--.

Col. 11, line 26, delete "AN" and insert --AND--.

line 60, delete "n-bit" and insert --$n$-bit--.

Col. 13, line 18, delete "m-bit" and insert --$m$-bit--.

Col. 12, line 48, delete "E1" and insert --$E_1$--.

UNITED STATES PATENT AND TRADEMARK OFFICE
CERTIFICATE OF CORRECTION

PATENT NO. : 4,807,196

DATED : February 21, 1989

INVENTOR(S) : TAKESHI MIZUKAMI

It is certified that error appears in the above-identified patent and that said Letters Patent is hereby corrected as shown below:

Col. 15, line 17, delete "m" and insert --$\underline{m}$--.

line 24, delete "m" and insert --$\underline{m}$--.

line 29, delte "n-bit" and insert --$\underline{n}$-bit--.

Signed and Sealed this

Sixteenth Day of January, 1990

*Attest:*

JEFFREY M. SAMUELS

*Attesting Officer*     *Acting Commissioner of Patents and Trademarks*